US010750584B2

(12) United States Patent
 Scott

(10) Patent No.: US 10,750,584 B2
(45) Date of Patent: Aug. 18, 2020

(54) LIGHTING WALL CONTROLLER HAVING TOUCH REJECTION CAPABILITY AND PROXIMITY DETECTION

(71) Applicant: ABL IP HOLDING LLC, Conyers, GA (US)

(72) Inventor: Jeffrey M. Scott, San Pablo, CA (US)

(73) Assignee: ABL IP HOLDING LLC, Conyers, GA (US)

( * ) Notice: Subject to any disclaimer, the term of this patent is extended or adjusted under 35 U.S.C. 154(b) by 244 days.

(21) Appl. No.: 15/916,800

(22) Filed: Mar. 9, 2018

(65) Prior Publication Data
US 2019/0281675 A1 Sep. 12, 2019

(51) Int. Cl.
| | |
|---|---|
| *G06F 3/01* | (2006.01) |
| *H05B 47/10* | (2020.01) |
| *H05B 45/00* | (2020.01) |
| *G06F 3/041* | (2006.01) |
| *G06F 3/044* | (2006.01) |

(Continued)

(52) U.S. Cl.
CPC ............ *H05B 45/00* (2020.01); *G06F 3/017* (2013.01); *G06F 3/044* (2013.01); *G06F 3/0418* (2013.01); *H04L 12/282* (2013.01); *G06F 2203/04112* (2013.01); *H05B 47/175* (2020.01)

(58) Field of Classification Search
None
See application file for complete search history.

(56) References Cited

U.S. PATENT DOCUMENTS 5,336,979 A * 8/1994 Watson ................ H05B 39/086
 315/194
5,570,113 A * 10/1996 Zetts .................... G06F 3/04883
 345/156

(Continued)

FOREIGN PATENT DOCUMENTS

CN 102801409 * 11/2012
WO WO2007150058 A3 * 12/2007

OTHER PUBLICATIONS www.microchip.com/downloads/en/DeviceDoc100001571B.pdf, Microchip, CAP1298, "8-Channel Capacitive Touch Sensor Controller With Proximity Detection & Signal Guard," Microchip Technology Inc., DS00001571B, pp. 1-68 (2013-2015).

(Continued)

*Primary Examiner* — Yongjia Pan
(74) *Attorney, Agent, or Firm* — RatnerPrestia

(57) ABSTRACT

A lighting wall controller having a capability to reject user inputs at a surface of the wall controller and/or proximity detection in accordance with sensing signals received at locations on and near the wall controller. Programming configures a processor for proximity detection to detect a presence of a conductive object within a predetermined distance to the wall controller. The processor further determines whether user inputs correspond to touches at locations on the wall controller or user gestures near the wall controller to perform one of a plurality of defined lighting functions for a lighting system. When user inputs do not correspond to defined lighting functions, a number of the non-defined inputs is counted to provide an indicator of activity on the surface of the wall controller to activate a locked mode for a duration of the non-defined inputs.

14 Claims, 9 Drawing Sheets

(51) Int. Cl.
 *H04L 12/28* (2006.01)
 *H05B 47/175* (2020.01)

(56) References Cited

U.S. PATENT DOCUMENTS

| | | | | |
|---|---|---|---|---|
| 5,594,238 | A * | 1/1997 | Endruschat | E03C 1/057 |
| | | | | 250/214 B |
| 7,115,856 | B2 | 10/2006 | Peng et al. | |
| 7,791,595 | B2 * | 9/2010 | Altonen | H05B 39/085 |
| | | | | 315/291 |
| 8,350,494 | B2 * | 1/2013 | Snook | H05B 37/0263 |
| | | | | 315/291 |
| 9,119,239 | B2 | 8/2015 | Engel-Hall et al. | |
| 9,226,376 | B2 * | 12/2015 | Bruwer | H05B 37/02 |
| 9,462,664 | B2 | 10/2016 | Engel-Hall et al. | |
| 10,102,742 | B2 * | 10/2018 | Dimberg | G01R 21/00 |
| 2004/0119484 | A1 * | 6/2004 | Basir | B60Q 5/003 |
| | | | | 324/680 |
| 2005/0236906 | A1 * | 10/2005 | Morgan | H03K 17/941 |
| | | | | 307/117 |
| 2011/0291922 | A1 * | 12/2011 | Stewart | G06F 3/03547 |
| | | | | 345/156 |
| 2013/0300316 | A1 * | 11/2013 | Engel-Hall | H05B 37/02 |
| | | | | 315/307 |
| 2016/0286625 | A1 * | 9/2016 | Olsen | H05B 33/0854 |
| 2017/0117891 | A1 * | 4/2017 | Lohbihler | G08C 17/02 |

OTHER PUBLICATIONS https://www.microchip.com/wwwproducts/MGC3030, "MGC3030/3130 3D Tracking and Gesture Controller Data Sheet" MGC3030/3130, Microchip Technology Inc., DS40001667E, pp. 1-50 (2012-2017).

http://www.miochip.com/design-centers/capacitive-touch-sensing/gestic-technology/over . . . , Microchip: GestIC Technology, "Microchip's Advanced Multi-Touch Controller", printed Feb. 15, 2018 (3 pages).

http://www.microchip.com/design-centers/capacitive-touch-sensing/gestic-technology/over . . . , Microchip; GestIC Technology, "Gesture Control: Simplicity", printed Feb. 15, 2018 (3 pages).

\* cited by examiner

LIGHTING WALL CONTROLLER HAVING TOUCH REJECTION CAPABILITY AND PROXIMITY DETECTION

TECHNICAL FIELD

The present subject matter relates to techniques and equipment for a lighting wall controller having a capability to reject touch inputs to the wall controller and/or having proximity detection.

BACKGROUND

Electrical powered artificial lighting has become ubiquitous in modern society. Common uses for electrical lighting devices include, for example, in homes, hospitals, buildings of commercial and other enterprise establishments, as well as in various outdoor settings. Traditional light fixtures or luminaires have tended to be relatively dumb, in that the light fixtures or luminaires power ON/OFF, and in some cases dim, usually in response to user activation of a relatively simple input device.

Since the advent of electronic light emitters, such as light emitting diodes (LEDs), for general lighting type illumination application, lighting equipment has become increasingly intelligent with incorporation of sensors, programmed controller and network communication capabilities. Automated control, particularly for enterprise installations or hospitals, may respond to a variety of sensed conditions, such as daylight or ambient light level and occupancy. The controllers for existing systems have interfaces to receive user input for lighting functions. There have been proposals and some products that offer touch or gesture inputs. The surfaces of the interfaces for controllers sense the user inputs; however, problems arise with erroneous or unrecognized sensed input at the controller.

A need exists for providing an improved interface module for controllers in lighting systems.

SUMMARY

The concepts disclosed herein alleviate the above noted problems with and/or improve over prior lighting technology, for example, by rejecting user touch inputs to a lighting wall controller during, for example, a cleaning process of a surface of the lighting wall controller, or detecting a user within a predefined distance to the lighting wall controller to initiate a lighting function in an area of the lighting wall controller. The technology examples discussed in more detail below offer a lighting wall controller having touch rejection capability and proximity detection.

An example wall controller for lighting includes a plurality of sensing electrodes, a lighting network data communication interface, and a processor coupled to receive sensing signals from a driver and sensing circuit for user inputs at a surface of the wall controller. The sensing electrodes are mounted to a substrate of the wall controller. The driver and sensing circuit is coupled to the sensing electrodes. The processor of the wall controller is coupled to a lighting network data communication interface and configured to process the sensing signals, and send lighting control messages, via the interface, to one or more luminaires in an area of the wall controller to control an output of the one or more luminaires based upon the user inputs at the surface of the wall controller. Memory is coupled to be accessible to the processor. The memory stores programming for execution by the processor and data to be saved or processed by the processor during execution of instructions included in the programming. Execution of the programming in the memory configures the processor to: receive a plurality of user inputs at a surface of the wall controller, wherein the plurality of user inputs are sensed by sensing electrodes; determine whether or not the plurality of user inputs at the surface of the wall controller correspond to a user input selection to perform one of a plurality of defined lighting functions; and when the determined plurality of user inputs at the surface of the wall controller do not correspond to any of the defined lighting functions, count a number of user inputs not corresponding to any of the defined lighting functions to provide an indicator of activity at the surface of the wall controller.

In another example, a method includes receiving a plurality of user inputs at a surface of a lighting wall controller, wherein the plurality of user inputs are sensed by at least one of touch sensing electrodes or gesture sensing electrodes arranged on a substrate of the wall controller. The wall controller includes instructions to define a plurality of lighting functions relative to the user input at the surface of the wall controller. The method further includes determining whether or not the plurality of user inputs at the surface of the wall controller correspond to touches at locations on the wall controller or user gestures near the wall controller for a user input selection to perform one of the defined lighting functions; and when the determined plurality of user inputs at the surface of the wall controller do not correspond to any of the defined lighting functions, count a number of the user inputs not corresponding to any of the defined lighting functions to provide an indicator of activity at the surface of the wall controller, wherein when the indicator of activity satisfies a predetermined threshold within a period of time, activating a locked mode for the wall controller, and wherein during the locked mode, each new sensed user input at the surface of the wall controller is rendered invalid.

In another example, a wall controller for lighting includes a plurality of sensing electrodes, a lighting network data communication interface, and a processor coupled to receive sensing signals for user inputs at locations on the wall controller, and user inputs of a type near the wall controller. The sensing electrodes are mounted to a substrate of the wall controller. A driver and sensing circuit is coupled to the sensing electrodes. The processor of the wall controller is coupled to a lighting network data communication interface and configured to process the sensing signals. Memory is coupled to and accessible to the processor. The memory stores programming for execution by the processor and data to be saved or processed by the processor during execution of instructions included in the programming. Execution of the programming in the memory configures the processor to: detect a presence of a conductive object within a predetermined distance to the wall controller in response to sensing signals received from at least one driver and sensing circuit, analyze sensing signals received from the driver and sensing circuit; generate a lighting control message based at least in part upon the detected presence of the conductive object within the predetermined distance to the wall controller and the analyzed sensing signals; and transmit the lighting control message to one or more luminaires in the area of the wall controller to control an output of the one or more luminaires based upon the detected presence of the conductive object and the instructions of the wall controller.

In another example, a method includes detecting a presence of a conductive object within a predetermined distance to a lighting wall controller in response to sensing signals received from at least one driver and sensing circuit; receiving sensing signals from the at least one driver and sensing circuit for user input of a type near a surface of the wall controller, wherein the wall controller includes instructions to define a plurality of lighting functions relative to at least one of gesture or touch input at the surface of the wall controller; analyzing the received sensing signals to determine a selection of a corresponding one of the lighting functions of the sensed user input; generating a lighting control message for the selected lighting function based upon the detected presence of the conductive object and the analyzed sensing signals; and transmitting, via a data communication network, the lighting control message to one or more luminaires in an area of the wall controller to control an output of the one or more luminaires based upon the detected presence of the conductive object and the instructions of the wall controller.

Additional advantages and novel features of the examples will be set forth in part in the description that follows, and in part will become apparent to those skilled in the art upon examination of the following and the accompanying drawings or may be learned by production or operation of the examples. The advantages of the present subject matter may be realized and attained by means of the methodologies, instrumentalities and combinations particularly pointed out in the appended claims.

BRIEF DESCRIPTION OF THE DRAWINGS

The drawing figures depict one or more implementations in accordance with the present concepts, by way of example only, not by way of limitations. In the figures, like reference numerals refer to the same or similar elements.

DETAILED DESCRIPTION

Figure 1:
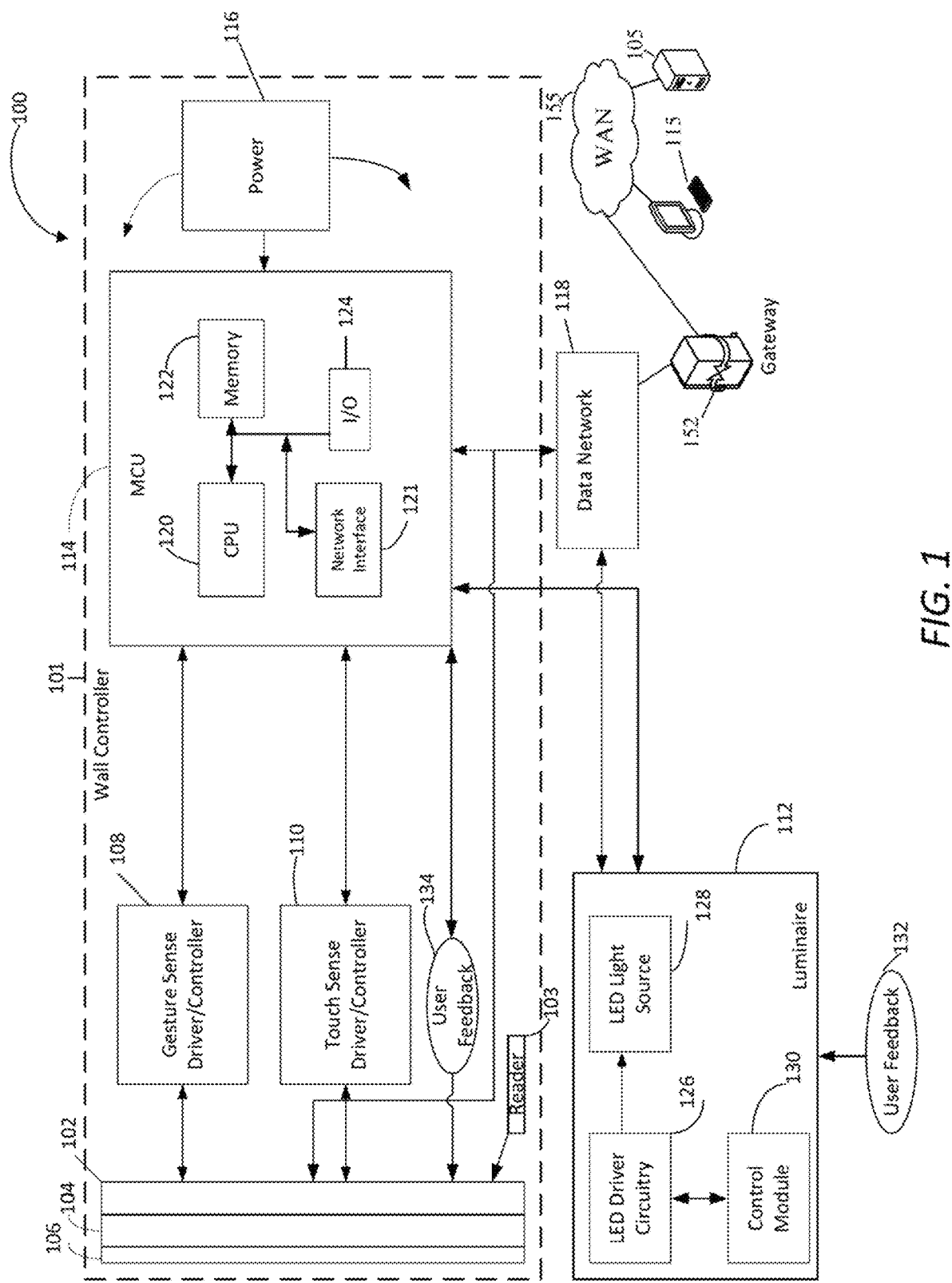
FIG. 1 is a simplified block diagram illustrating an example of a lighting system and devices including a wall controller having a capability to reject touch inputs to the wall controller, and detect proximate gesture input near a surface of the wall controller to control a light source of a luminaire.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The term "luminaire," as used herein, is intended to encompass essentially any type of device that processes energy to generate or supply artificial light, for example, for general illumination of a space intended for use of occupancy or observation, typically by a living organism that can take advantage of or be affected in some desired manner by the light emitted from the device. However, a luminaire may provide light for use by automated equipment, such as sensors/monitors, robots, etc. that may occupy or observe the illuminated space, instead of or in addition to light provided for an organism. However, it is also possible that one or more luminaires in or on a particular premises have other lighting purposes, such as signage for an entrance or to indicate an exit. In most examples, the luminaire(s) illuminate a space or an area to a level useful for a human in or passing through the space, e.g. general illumination of a room or corridor in a building or of an outdoor space such as a street, sidewalk, parking lot or performance venue. The actual source of illumination light in or supplying the light for a luminaire may be any type of artificial light emitting device, several examples of which are included in the discussions below.

The term "wall controller," as used herein, is intended to encompass any type of device, component, or combination thereof that communicates with a lighting system to control operations of luminaires, for example, turning the luminaires on/off, adjusting a dimming level, or any other preset function that may be based on executable software of hardware program code. The wall controller is typically located within a lighting zone. The wall controller is not limited to wall mounting and may be arranged on any surface or as a mobile device, such as a laptop computer, tablet or smartphone, which allow communication with the luminaires of the lighting system.

Terms such as "artificial lighting," as used herein, are intended to encompass essentially any type of lighting that a device produces light by processing of electrical power to generate the light. An artificial lighting device, for example, may take the form of a lamp, light fixture, or other luminaire that incorporates a light source, where the light source by itself contains no intelligence or communication capability, such as one or more LEDs or the like, or a lamp (e.g. "regular light bulbs") of any suitable type. The illumination light output of an artificial illumination type luminaire, for example, may have an intensity and/or other characteristic(s) that satisfy an industry acceptable performance standard for a general lighting application.

The term "coupled" as used herein refers to any logical, optical, physical or electrical connection, link or the like by which signals or light produced or supplied by one system element are imparted to another coupled element. Unless described otherwise, coupled elements or devices are not necessarily directly connected to one another and may be separated by intermediate components, elements or communication media that may modify, manipulate or carry the light or signals.

The term "gesture" as used herein refers to movement of a part or appendage of a user's body, such as a hand or one or more fingers, etc., according to one or more designated movements to express an intended action.

Light output from the luminaire may carry information, such as a code (e.g. to identify the luminaire or its location) or downstream transmission of communication signaling and/or user data. The light-based data transmission may involve modulation or otherwise adjusting parameters (e.g. intensity, color characteristic or distribution) of the illumination light output from the device.

Detailed references to examples illustrated in the accompanying drawings and discussed below are provided. FIG. 1 is a simplified block diagram illustrating an example of a lighting system and devices including a wall controller having a capability to reject touch inputs to the wall controller, and/or detect proximate gesture input near a surface of the wall controller to control a light source of a luminaire.

A lighting system 100 of FIG. 1 uses, for example, a data network 118 and devices that provide a variety of lighting capabilities, including communication in support of lighting functions such as turning lights on/off, dimming, or other system control functions utilizing a wall controller 101 with touch and touchless sensing capabilities, for example, to control an output of a light source 128 of luminaire 112. The wall controller and luminaire in the lighting system 100 may be, for example, Acuity Brands Lighting nLight® enabled devices, meaning the devices are networked together and have the ability to communicate over an nLight® network using a software application such as SensorView. Alternatively, the devices of the lighting system 100 are not limited by the nLight® network, and may be configured to communicate using another backbone network architecture and protocol known in the art, for example, 0-10 v, Digital Addressable Lighting (DALI), BACnet, DMX, RDX, Phase-Cut, etc. Communication may use any suitable wired or wireless media.

Luminaire 112 includes a controller 130 (e.g., a control module or micro-control unit) that executes a lighting application for wired communication via wired links, in an example, and over a data network 118 such as a local area network (LAN) or the like, of control and systems operations information during control network operations over the data network 118 and during associated touch and touchless sensing by the wall controller. Optionally, each of the devices of lighting system 100 are connected to gateway 152 via the network 118.

CAT5e type cabling may be used between the devices for the wired communications via the LAN. The cable type example of the data network 118 may use any available standard data communication technology, such as Ethernet, RS485, PLC or the like.

Alternatively, the lighting system 100 may use a wireless communication architecture in which case the data network 118 could serve as a wireless access point with each component of the system 100 connected directly to the same network 118 without having to access a gateway. The wireless example of the data network 118 may use any available standard wireless data communication technology, such as WiFi, Bluetooth Low Energy (BLE), Z-wave, LiFi, sub-GHz, etc. Li-Fi is a form of visible light communication and a subset of optical wireless communication (OWC), and uses light from light-emitting diodes (LEDs) as a medium to deliver networked, mobile, high-speed communication in a similar manner to WiFi with the exception that WiFi utilizes radio waves, while LiFi uses visible light. Alternatively, the wireless network may use a proprietary protocol implemented by nLight Air® products.

The luminaire 112 is illustrated in FIG. 1 as a single unit; however, a plurality of luminaires may be provided in the lighting system 100. The lighting system 100 may be in any location or locations serviced for lighting and other purposes by a networked intelligent lighting system of the type described herein. The luminaire or luminaires 112 are located to provide lighting service in various areas in or about the area of a wall controller. Most of the examples discussed below focus on building installations, for convenience, although the system may be readily adapted to outdoor lighting. Hence, the lighting system 100 provides lighting and possibly other services, for example, HVAC and other building management services in a number of service areas in or associated with a building, such as HVAC, surveillance, door access, etc. to various rooms, hallways, corridors, or storage areas of a building and an outdoor area associated with the building. Any building on or at the premises, for example, may be an individual or multi-tenant resident dwelling or may provide space for one or more enterprises and/or any combination of residential, office and enterprise facilities.

In the example of FIG. 1, the wall controller 101 includes a substrate 102, and an arrangement of gesture and touch sensing electrodes 104 arranged on a substrate. The wall controller may further include an overlay 106, and for example, a reader 103 arranged on the substrate 102 to read firmware of storage media (discussed below) associated with the wall controller so that user input in the form of, for example, touch and gesture motions detected by the gesture and touch sensing electrodes 104 correspond to predefined functions to control operation of the luminaires in the lighting system. The wall controller 101 further includes a micro-control unit (MCU) 114 that is accessible to the luminaire 112. As illustrated in FIG. 1, the MCU 114 is coupled to communicate and process data received from the luminaire 112 via input/output (I/O) interface 124, as well as touch and touchless data related to electrodes 104 that is received from gesture sense driver/controller 108 and/or touch sense driver/controller 110. MCU 114 includes a memory 122 (volatile and non-volatile) and a central processing unit or "CPU" 120 that are coupled to each other and the I/O interface 124 via internal data links. The CPU 120 is also coupled to communicate via the network interface 121 and the network link with one or more others of the luminaires 112 or devices of the lighting system 100, in the example, via the data network 118. The MCU 114 and the CPU 120 may be implemented via hardwired logic circuitry, but in the examples, the processor is a programmable processor such as a central processing unit (CPU) 120 of a microcontroller or microprocessor. The memory 122 stores programming for execution by the CPU 120 of the micro-control unit 114 and data that is available to be processed or has been processed by the CPU 120. The memory 122, for example, may include a lighting application (which can be firmware) for lighting control and management operations. Execution of the programming by the CPU 120 configures the wall controller 101 to perform the functions or procedures as described below, for example, in FIGS. 7 and 9. The CPU, the memory, the I/O, and the network interface of the MCU 114 typically are all included on a single chip and sometimes referred to as a "system on a chip" or SoC. Although shown separately, other elements of the circuitry of the wall controller, such as either one or both of the sense driver/controllers, may be included on the same SoC. Additionally, the wall controller is described for use in a lighting system; however, the wall controller may also be used, for example with building management systems (BMS) to manage and control other systems such as HVAC, building security or entry, etc.

The lighting system 100 may comprise a mix and match of various indoor systems, wired lighting systems (e.g., nLight® wired), or wireless lighting systems (e.g., nLight® Air), emergency, and outdoor products that are networked together to form a collaborative and unified lighting solution or building management systems. Additional control devices and lighting fixtures, gateway(s) 114 for backbone connection, time sync control, data collection and management capabilities, and interoperation with Acuity Brands Lighting's commercially available SensorView product may also be provided.

Figure 2:
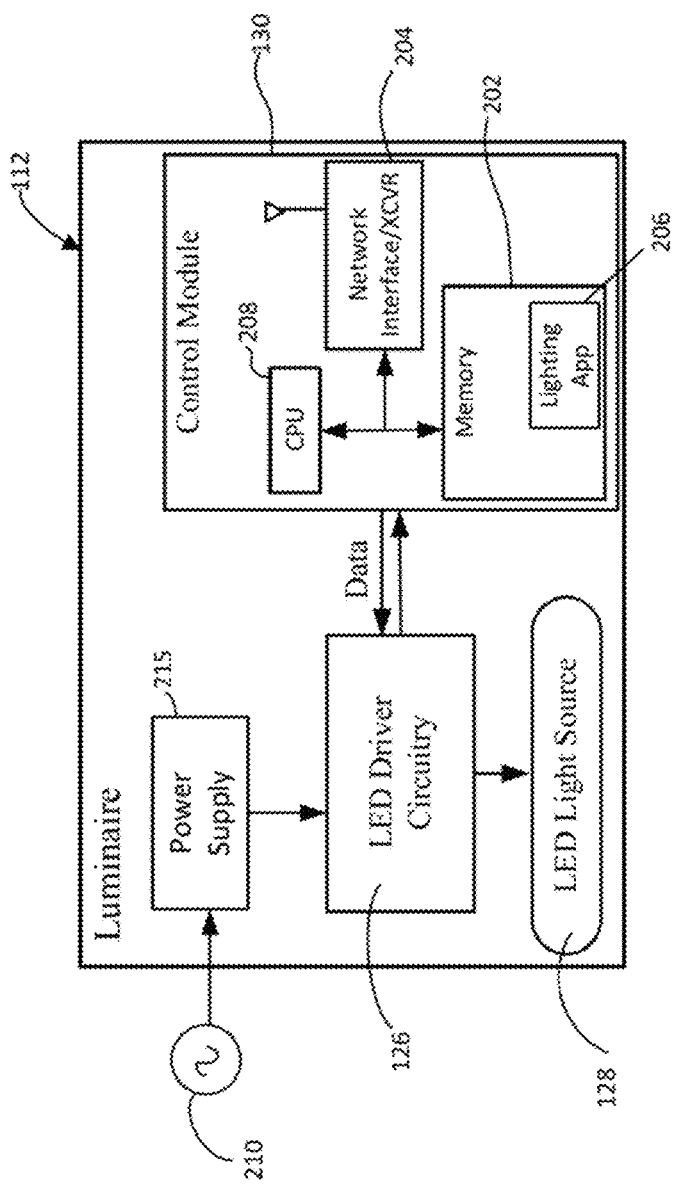
FIG. 2 is a block diagram of a luminaire that operates in and communicates via the lighting system of FIG. 1.

FIG. 2 is a block diagram of a luminaire that operates in and communicates via the lighting system of FIG. 1. Luminaire 112 is an integrated lighting device that generally includes the power supply 215 driven by a power source 210. Power supply 215 receives power from the power source 210, such as an AC main, battery, solar panel, or any other AC or DC source. Power supply 215 may include a magnetic transformer, electronic transformer, switching converter, rectifier, or any other similar type of circuit to convert an input power into a power signal suitable for luminaire 112.

Luminaire 112 further includes LED driver circuitry 126, control module 130, and, a light source that is, for example, a lighting emitting diode (LED) light source 128. In most examples, the luminaire 112 illuminates a service area to a level useful for a human in or passing through the space, e.g., a regular illumination of a room or corridor in a building, such as a hospital, a store, and/or provide an indoor visible light source based positioning system. For purposes of example, the light source 128 is illustrated and described as a LED type light; however, the light source 128 may be virtually any type of light source suitable for providing the intended type of light output that may be electronically controlled. The light source 128, for example, may provide visible light output as providing illumination for human occupancy or the like and/or visible light source based positioning. The light source 128 may be of the same general type in all of the luminaires that would be in the area, e.g., all formed by some number of light emitting diodes (LEDs); although in many installations, some number of light luminaires may have different types of light sources 128, e.g. some use LEDs, some use compact or tube type fluorescent sources, etc.

LED driver circuitry 126 is coupled to LED light source 128 and drives the LED light source 128 by regulating the power to the LED light source 128 by providing constant quantity or power LED light source 128 as its electrical properties change with temperature, for example. The LED driver circuitry 126 includes a driver circuit that provides power to LED light source 128. LED driver circuitry 126 may be a constant-voltage driver, constant-current driver, or AC LED driver type circuit that provides dimming through a pulse width modulation circuit and may have many channels for separate control of different LEDs or LED arrays.

LED driver circuitry 126 can further include an AC or DC current source or voltage source, a regulator, an amplifier (such as a linear amplifier or switching amplifier), a buck, boost, or buck/boost converter, or any other similar type of circuit or component. LED driver circuitry 126 outputs a variable voltage or current to the LED light source 128 that may include a DC offset, such that an average value is nonzero, and/or an AC voltage.

Control Module 130 is coupled to the LED driver circuitry 126 and controls the light source operation of the LED light sources 128. Control Module 130 includes a memory 202 (volatile and non-volatile) and a central processing unit (CPU) 208 that are coupled by a network interface 204. The CPU 208 may also be coupled to communicate via the network interface 204 and the network link with one or more others of the luminaires or devices of the system of FIG. 1. The CPU 208 may be implemented via hardwired logic circuitry, but in the examples, the processor is a programmable processor such as a central processing unit (CPU) 208 of a microcontroller or a microprocessor. The memory 202 stores programming for execution by the CPU 208 of the Control Module 130 and data that is available to be processed or has been processed by the CPU 208. The memory for example, may include a lighting application 206 (which can be firmware) for lighting control and management operations. The processors and memories in the luminaire may be substantially the same throughout the luminaires 112 in an area or space, or different luminaires 112 may have different processors 208 and/or different amounts of memory 202, depending on differences in intended or expected processing needs.

The network interface 204 in each luminaire 112 in a particular service area will be of a physical type and configured to operate in a manner that is compatible with the physical media and electrical protocol(s) implemented for the particular service area and/or throughout the premises of the system. Although FIG. 2 shows the luminaire 112 having one network interface 204, some or all of the luminaires 112 may have two or more network interfaces 204 to enable data communications over different media with the network(s) and/or with other devices in the vicinity.

In the examples, the control module 130 and the network interface 204 are integrated with the other elements of the luminaire 112, or attached to the luminaire 112 or other elements that incorporate the light source 128. However, for some installations, the light source 128 may be attached in such a way that there is some separation between the luminaire and other element that incorporate the electronic components that provide the intelligence and communication capabilities. For example, the communication components and possibly the CPU 208 and memory 202 may be elements of a separate device or component coupled and/or collocated with the luminaire 112.

Figure 3:
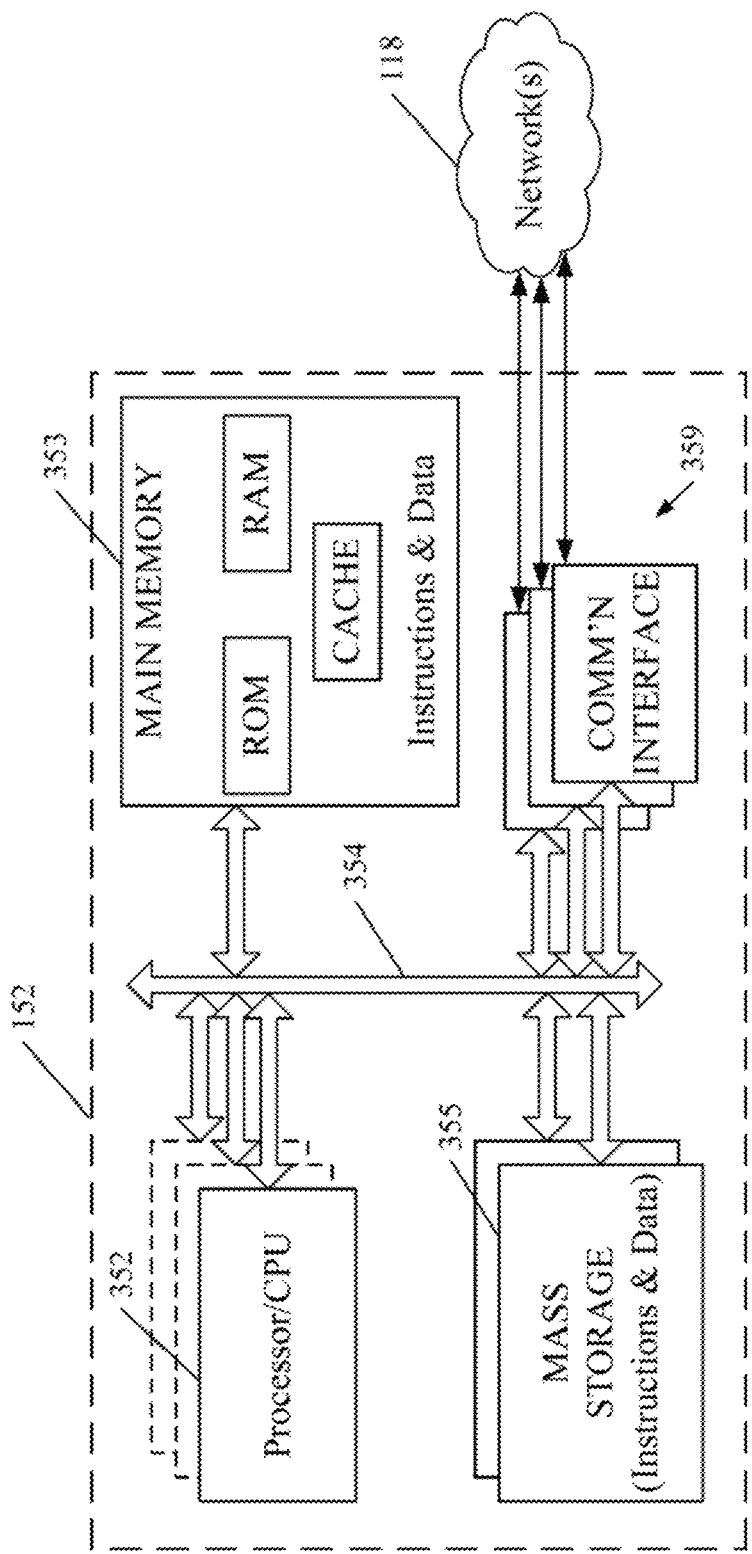
FIG. 3 is a simplified block diagram of a computer that may be configured as a host or server, for example, to function as the gateway of server in the system of FIG. 1.

FIG. 3 is a simplified block diagram of a computer that may be configured as a host or server, for example, to function as the gateway or server in the system of FIG. 1.

The example gateway 152 will generally be described as an implementation of a server computer. Alternatively, the computer system may comprise a mainframe or other type of host computer system capable of web-based communications, media content distribution, or the like via the data network 118.

The gateway 152 in the example includes a central processing unit (CPU) 352, a main memory 353, mass storage 355, and an interconnect bus 354. The circuitry forming the CPU 352 may contain a single microprocessor, or contain a number of microprocessors for configuring the gateway 152 as a multi-processor system, or may use a higher speed processing architecture. The main memory 353, in the example, includes ROM, RAM and cache memory; although other memory devices may be added or substituted. Although semiconductor memory may be used in the mass storage 355, magnetic type devices (tape or disks) and optical disk devices typically provide higher volume storage in host computer or server application. In operation, main memory 353 is accessible to CPU 352 and stores at least portions of instructions and data for execution by the CPU 352, although instructions and data are moved between memory and storage and CPU 352 via the interconnect bus 354.

The gateway 152 also includes one or more input/outputs interfaces for communications, shown by way of example as interfaces 359 for data communications via the data networks 118 and 155. Each interface 359 may be a high-speed modem, an Ethernet (optical, cable or wireless) card or any other appropriate data communications device.

The gateway 152 runs a variety of applications programs and stores the necessary information for support of the wall controller having a capability to reject touch inputs to the wall controller, and/or detect proximate gesture input near a surface of the wall controller to control a light source of a luminaire as described herein. One or more such applications, such as the light management software application SensorView, manage light functions of the luminaires based upon sensed touch and touchless data obtained during operation of the wall controller 101 within the lighting system 100. Those skilled in the art will recognize that the gateway 152 may run other programs and/or host other light management functions.

In an example, the lighting system 100 is installed at a building premises. The system 100 also includes a data communication or wireless controller network 118 that interconnects the links to/from the network communication interfaces of the luminaire 112 and wall controller including a substrate 102, gesture sensing and touch sensing electrodes 104 and micro-control unit 114, so as to provide data communications amongst the luminaire 112. The data network 118 may support data communication by equipment at the premises via wired (e.g. cable or fiber) media or via wireless (e.g. WiFi, Bluetooth, ZigBee, Z-wave, etc.) or combinations of wired and wireless technology. Such a data network 118, for example a short range or local area network (LAN), also is configured to provide data communications for at least some of the light fixtures luminaires 112 and other equipment at the premises (not shown), and via a data network 155 outside the premises, shown by way of example as a wide area network (WAN), so as to allow the luminaire 112 at the premises to communicate with outside devices such as the server/host computer 105 and the user terminal device 115.

Figure 4:
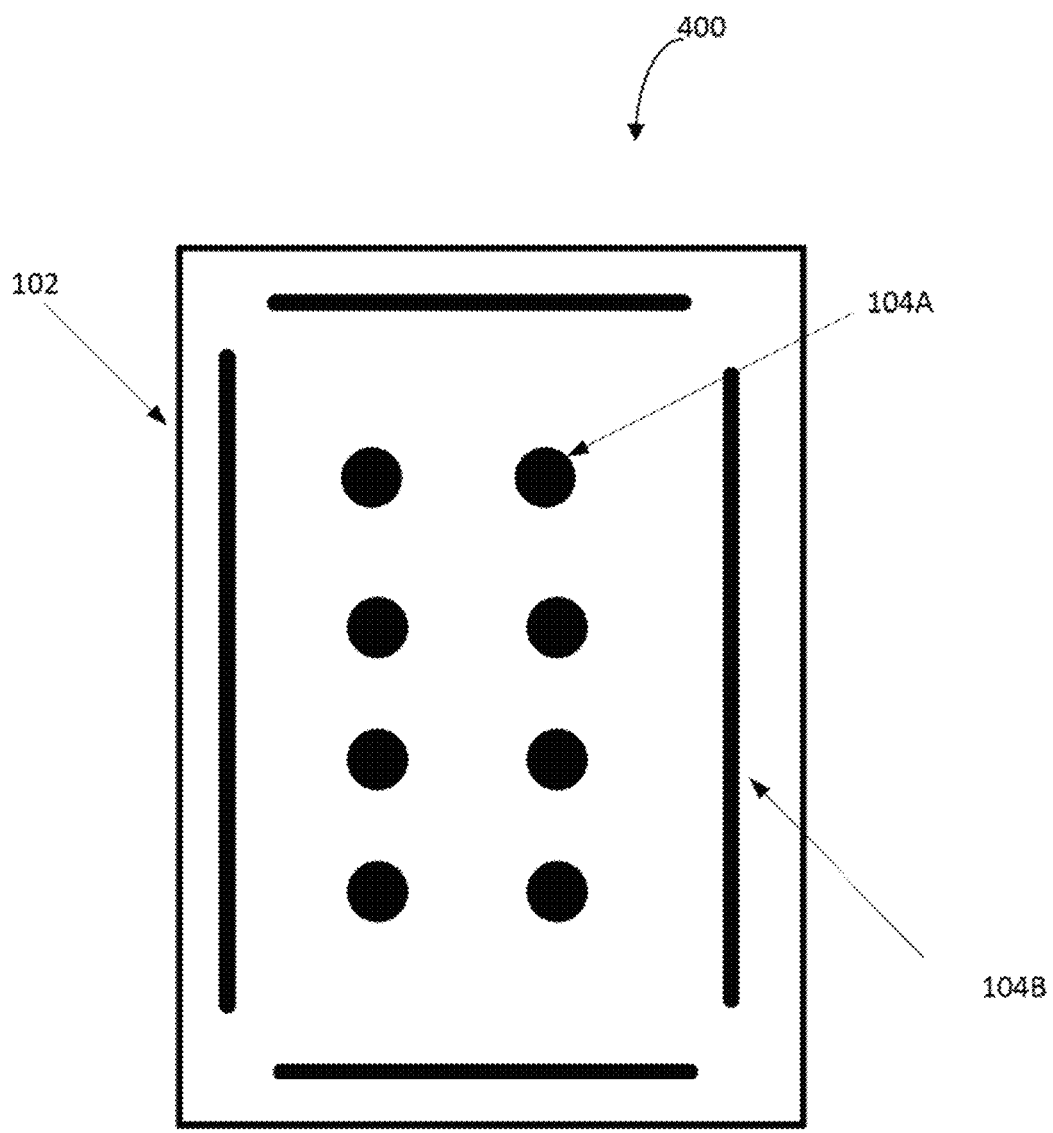
FIG. 4 is a simplified diagram of the touch sensing and gesture sensing electrodes on a substrate.

FIG. 4 is a simplified diagram of sensing electrodes such as the touch sensing and gesture sensing electrodes arranged on a substrate. In FIG. 4, a plurality of electrodes are arranged on a substrate or printed circuit board (PCB) 102. The plurality of electrodes include touch sensing capacitive electrodes 104A which are arranged in a middle or central area of the substrate 102, and gesture sensing electrodes 104B which are arranged around a perimeter of the substrate 102. The touch sensing capacitive electrodes 104A may be any self-capacitance configuration type known in the art to provide a variety of button and proximity functionality, for example, a CAP1298 Microchip capacitive touch sensor. The gesture sensing electrodes 104B may be any sensors that use electric field (E-field) sensing to detect near field gestures from conductive objects such as the human body, for example, a MGC3030/3130 Microchip.

In FIG. 4, at least four (4) gesture sensing electrodes 104B are arranged around the perimeter of substrate 102 with, for example, eight (8) touch sensing capacitive electrodes 104A in the middle or central area of the substrate 102 and surrounded by the gesture sensing electrodes 104B. Alternatively, an additional fifth ($5^{th}$) gesture sensing electrode may be arranged in the central area of the substrate 102 with the touch sensing capacitive electrodes 104A, for example, one gesture sensing electrode in each of a north, south, east, west and center area of the substrate 102.

Figure 5C:
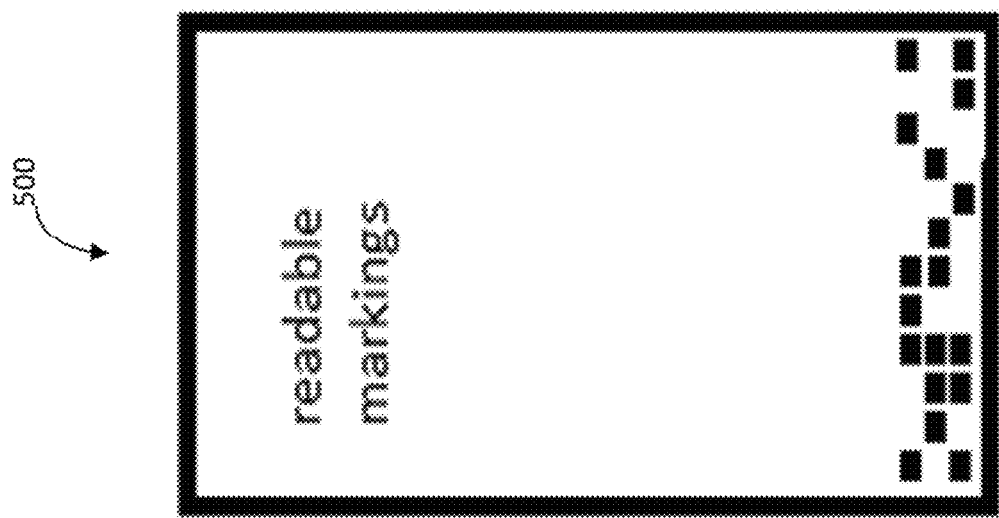
FIGS. 5A, 5B and 5C are exemplary diagrams illustrating overlays and various types of storage media for use with the wall controller in the lighting system of FIG. 1.
Figure 5B:
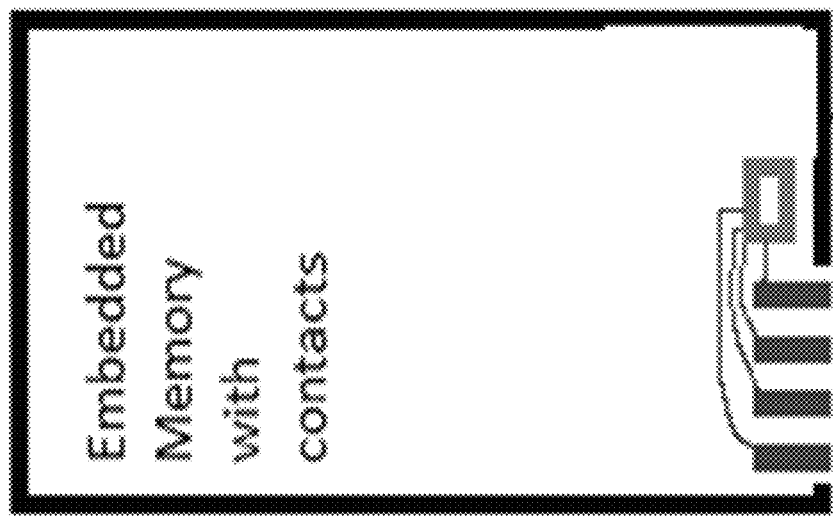
Figure 5A:
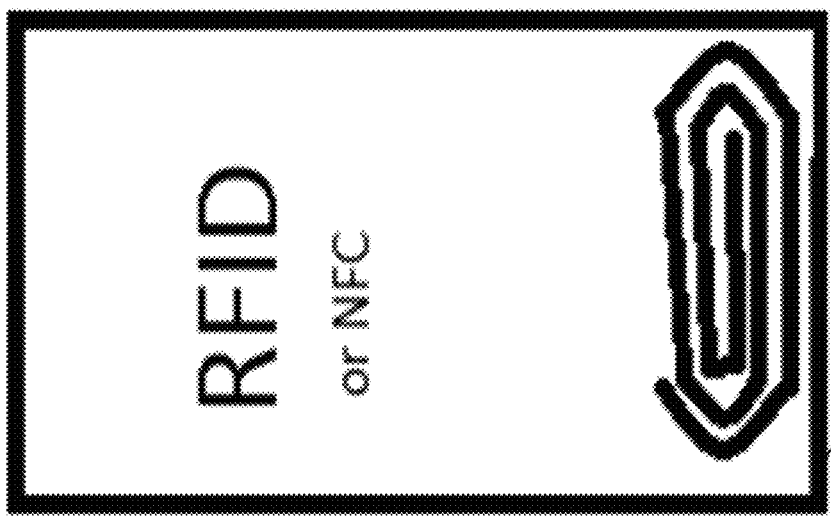

FIGS. 5A, 5B and 5C are exemplary diagrams illustrating overlays that may be included on the wall controller, and various types of storage media for accommodating the instructions and firmware for use with the wall controller in the lighting system of FIG. 1. As stated above, the term "wall controller" encompasses any type of device, component or combination that communicates with a lighting system to control operations of luminaires, and is not limited to wall mounting. The overlay 106 is arranged over the sensing electrodes 104 in the lighting system 100 for input to the wall controller 101. The overlay may be a translucent, transparent or opaque structure secured to a surface of the wall controller 101. In an example, a front surface of the overlay 106 that is visible to a user of the wall controller may include labeling or graphics to indicate to the user the functions of buttons or gestures required to operate or input information for the lighting system, such as turning the system on/off, dimming, light color changes, etc. Storage media may be integrally connected to and located on a rear surface of the overlay 106. The storage media contains the firmware (which can be digital data or analog data format) and program code for the functions of the buttons or gestures required for the layout of the wall controller. The storage media may also be arranged separately from the overlay and directly or indirectly connected to a rear surface of the overlay. In an example, information or instructions to identify the functions of the wall controller with reference to the electrodes 104 are read, converted to digital format, when necessary, by a media reader 103 in FIG. 1, and transmitted to at least one of the gesture sense driver/controller 108 and touch sense driver/controller 110 to aide in detection and function of the user's sensed touch and/or gesture motions with the wall controller. In an alternative example, the storage media may contain identification character or code to provide access to remote firmware or updates containing information or instructions to identify the functions of the wall controller with reference to the electrodes 104 transmitted to at least one of the gesture sense driver/controller 108 and the touch sense/driver/controller 110. For example, the identification character or code may be used to download or install firmware from a networked server or a local commissioning device to provide information and instructions to identify the functions of the overlay with reference to user input sensed by the electrodes 104.

FIG. 5A illustrates an example of an overlay 502 that may be used with the wall controller, and is illustrated as transparent for ease of explanation herein. The overlay may include customized labeling on a front surface and storage media, such as a radio frequency identification (RFID) or a near field chip (NFC), located on a rear surface of the overlay to store firmware required to recognize a predetermined function of the sensed touch and gesture motions of a user of the wall controller.

FIG. 5B illustrates an example of an overlay 504 which is illustrated as transparent for ease of explanation herein, but may have customized labeling on a front surface and storage media such as embedded memory with contacts located on a rear surface of the overlay to store firmware required to recognize a predetermined function of the sensed touch and gesture motions of a user of the wall controller.

FIG. 5C illustrates an example of an overlay 506 that is illustrated as transparent for ease of explanation herein, but may have customized labeling on a front surface and storage media such as readable markings located on a rear surface of the overlay to store firmware required to recognize a predetermined function of the user inputs such as sensed touch and gesture motions of a user of the wall controller.

In each of FIGS. 5A, 5B, and 5C, the overlay is transparent to more clearly illustrate the storage media that may be integrally connected or configured separate from the overlay, and located on the rear surface of the overlay. When the wall controller 101 of the lighting system of FIG. 1 includes an overlay 502, 504, 506 having a configuration such as in FIG. 5A, 5B or 5C, the firmware (digital data or analog data) stored in storage media on the rear surface of the overlay is read by a media reader 103, and used in conjunction with other components within the wall controller of the lighting system to detect the presence of a conductive object, analyze sensed signals, activate a lockout mode when needed, and perform the desired control functions of the light sources based upon the sensed touch and/or gesture motions of the user of the wall controller and lighting system. Although the storage media in each of FIGS. 5A, 5B and 5C is illustrated in a bottom portion of the overlay 502, 504, 506, the storage media may be arranged on any area of the rear surface of the overlay that would permit a connection to the media reader. When the firmware is an analog format, the media reader 103 includes an analog to digital converter (ADC) to convert the analog data to digital data.

Figure 6D:
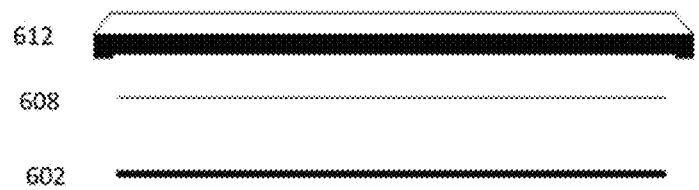
FIGS. 6A, 6B, 6C and 6D are simplified diagrams illustrating the stack-up assembly of the wall controller for the lighting system of FIG. 1.
Figure 6C:
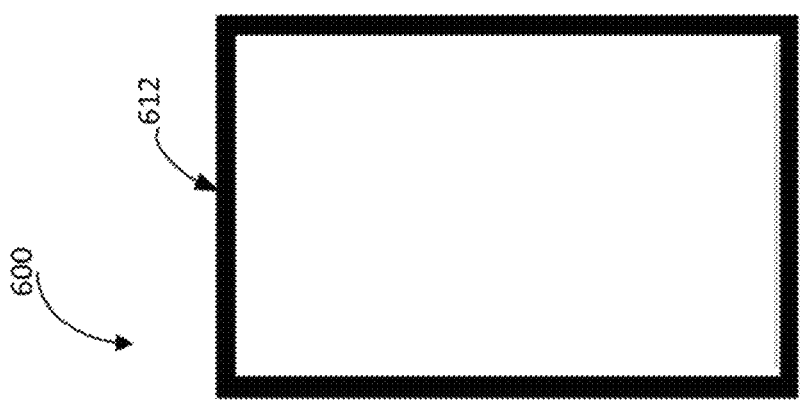
Figure 6B:
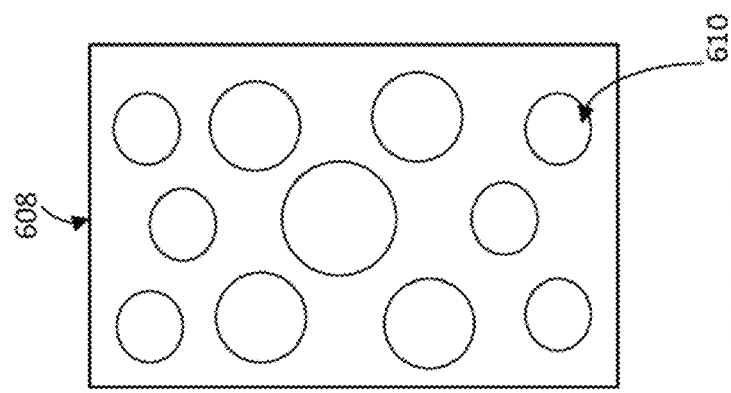
Figure 6A:
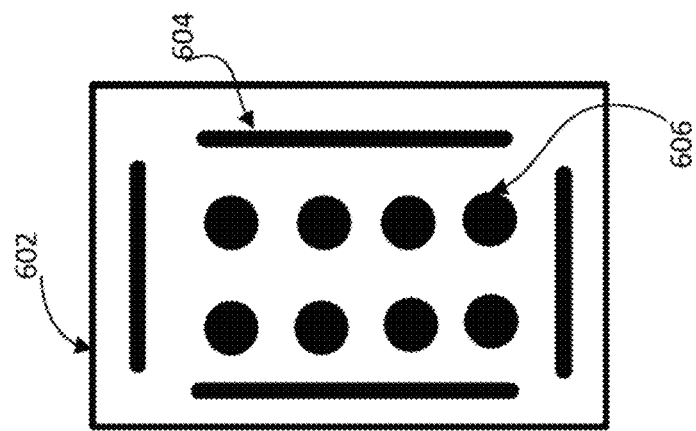

FIGS. 6A, 6B, 6C and 6D are simplified diagrams illustrating the stack-up assembly of the wall controller for the lighting system of FIG. 1. FIG. 6A illustrates the substrate 602 having a plurality of sensing electrodes, for example, touch sensing capacitive electrodes 606 and gesture sensing electrodes 604 arranged thereon. FIG. 6B illustrates an overlay 608 having, for example, customized graphics 610 thereon. The customized graphics may include any alphanumeric or numeric characters, shapes or designs that may functionally identify to a user an area of the overlay to input a desired lighting function. FIG. 6C is a transparent front plate 612 positioned over the overlay 608 to secure the overlay 608 to the wall controller. The front plate 612 is made of any rigid or semi-rigid material to secure the overlay 608 to a surface of the wall controller, as well as to permit visual and tactile access to the overlay 608. FIG. 6D illustrates a side view of the complete stack-up for the substrate 602, overlay 608 and the front plate 612 of the wall controller 101.

Figure 7:
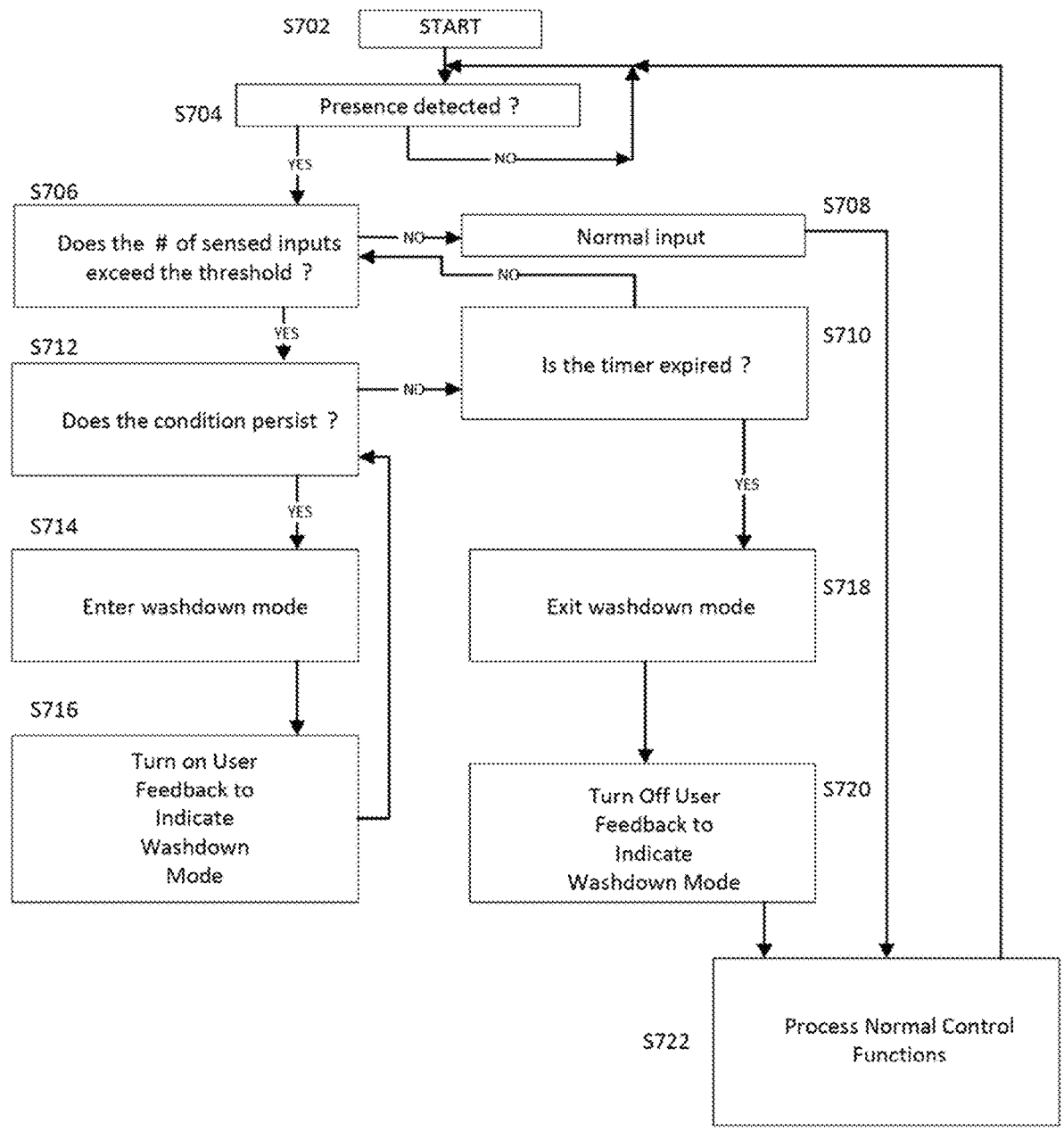
FIG. 7 is a flow chart illustrating a process for detecting erroneous input conditions such as during a cleaning or a wipe down of a wall controller in accordance with sensing signals from user inputs at the wall controller of the lighting system of FIG. 1.

FIG. 7 is a flow chart illustrating a process for detecting erroneous input conditions such as during a cleaning or wipe down of a wall controller based upon sensing signals from user inputs at the wall controller of the lighting system of FIG. 1.

The process begins at step S702 in which the wall controller of the lighting system is in an ON position. In the ON position, power is supplied to the components of the wall controller; however, the wall controller may be in one of an active or sleep mode.

At S704, a decision is made regarding the presence of a conductive object within a predetermined distance to the lighting wall controller. The presence may be user input at a surface of the wall controller that is detected by sensing electrodes arranged on a substrate of the wall controller, for example, at least one of gesture sensing or touch sensing electrodes. The conductive object may be an appendage of a human body, for example, a hand, a finger, or a foot, or a metal object within a distance of 0-10 cm, for example, to a surface of the wall controller that is sensed or detected by at least one of the touch sensing electrodes 104A or the gesture sensing electrodes 104B (FIG. 4). The gesture sensing electrodes 104B are electric field sensors arranged on the substrate of the wall controller to detect a conductive material or object. As described above, at least four (4) gesture sensing electrodes are arranged at a perimeter of a substrate or printed circuit board of the wall controller. The touch sensing electrodes 104A (FIG. 4) are arranged in a central portion of the substrate, and may be configured to detect a change in capacitance due to close proximity of a non-physical touch, as well as a physical touch at a surface of the electrode. Other quantities and configurations for the sensing electrodes may be used. The presence of the conductive object within a predetermined distance to the wall controller may be the result, for example, of a single or plurality of gestures or motions near the surface of the wall controller, or touch inputs sensed at a surface of the wall controller. Firmware and instructions, included within or accessible to the wall controller, define a plurality of lighting functions for the lighting system that are relative to touch and gesture user inputs at the surface of the wall controller, and a configuration of the sensing electrodes on the substrate. When NO, the presence of a conductive object is not detected, the process remains at S704 in a sleep mode until a conductive object is detected. When YES, a conductive object is detected, a processor of the wall controller may switch the wall controller from the sleep mode to a normal mode, and the process continues to step S706.

At S706, a plurality of user inputs from at least one of the touch sensing or gesture sensing electrodes is sensed at a surface of the wall controller. The sensed input signals are analyzed to determine whether the sensed user inputs correspond to touches at locations on the wall controller or user gestures near the wall controller for a user input selection to perform one of the plurality of defined lighting functions of the lighting system. When the sensed user inputs at the surface of the wall controller do not correspond to any of the defined lighting functions, the sensed user touch inputs at other locations on the wall controller or non-defined user gestures near the wall controller are counted to provide an indicator of activity at the surface of the wall controller. A timer is also initiated during the count of non-defined user input. When the indicator of activity at the surface of the wall controller exceeds a threshold, for example, 3 sensed user inputs, the process continues to step S712. At S712, when the indicator of activity exceeds the threshold within an adjustable period of time of the timer, for example, 3-7 seconds, a locked mode or washdown mode is activated for the wall controller at step S714. Both the threshold for user activity and the period of time in which the user activity occurs are adjustable and determined by the user of the system during installation or a system set-up mode. The process continues to S716.

At S716, an indication is provided, such as a blinking or steady illuminated LED on a surface of the wall controller, to provide notification of the locked mode. During the locked mode, each new sensed user input at the surface of the wall controller is rendered invalid. As such, a lighting level of the one or more luminaires in the area is unchanged by the non-defined input and normal lighting control functions are suspended during the locked mode. During the locked mode, the processor may continue to process input to the controller, for example, during an emergency event, for a control sequence that may override the locked mode, or analysis of system events/performance. The process returns to S712. The wall controller remains in the locked mode for the duration of the sensed user touch inputs on a surface of the wall controller that do not correspond to defined lighting functions or non-defined user gestures near the wall controller.

When the sensed user inputs at S706 correspond to a user selection to perform one of the defined lighting functions and do not exceed the indicator of activity threshold, the process continues to step S708, and the sensed user input is processed as normal input. The normal input to the wall controller is processed for selection of one of the plurality of defined lighting functions at step S722.

Returning to S706, when the indicator of activity exceeds the threshold, the timer runs for a period of time to check for new sensed user inputs at the surface of the wall controller. At an expiration of the period of time, when there are newly sensed inputs that do not correspond to any of the defined lighting functions, the timer is reset to continue checking for new sensed inputs which would reflect continued activity and erroneous inputs at the surface of the wall controller.

At step S710, when the period of time has expired on the timer, for example, 20 seconds, and there are sensed user inputs that correspond to touches at locations on the wall controller or gestures near the wall controller for a user input selection to perform one of the defined lighting functions, the process continued to step S718. At S718, the locked mode is deactivated, and the blinking or steady illuminated LED is switched OFF at S720 to indicate the locked mode for the wall controller is ended. The process continues to S722.

At step S722, operation of the wall controller is a normal mode for processing user input selection of one of the defined lighting functions. After the selected lighting function is performed, the process returns to S704 to await the presence of user input at the surface of the wall controller.

Figure 8B:
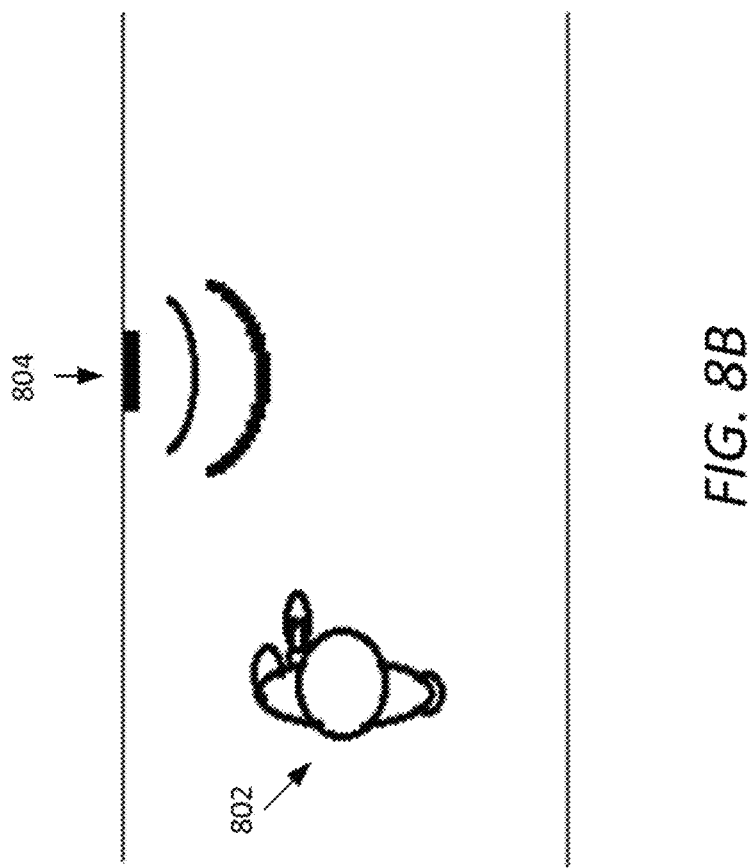
FIGS. 8A and 8B are simplified diagrams illustrating a side view and top view, respectively, of a user approaching or proximate a wall controller in the lighting system of FIG. 1.
Figure 8A:
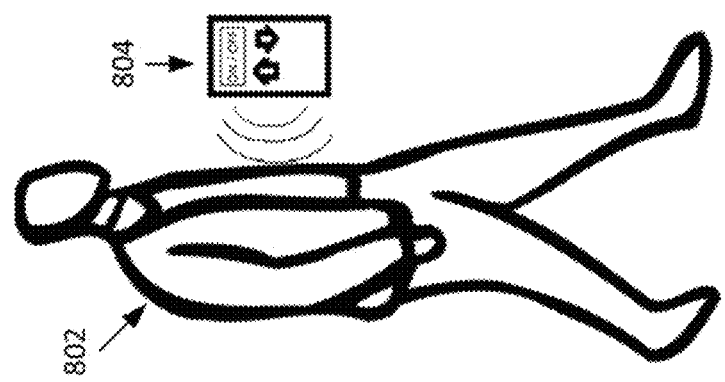

FIGS. 8A and 8B are simplified diagrams illustrating a side view and a top view, respectively, of a user approaching or proximate a wall controller in the lighting system of FIG. 1. In FIGS. 8A and 8B, a user 802 is sensed by sensors of the wall controller 804 when within a sensing distance of about 0-25 cm to a surface of the wall controller 804. The presence or proximity sensing distance is adjustable, but greater than a sensing range for gesture or touch user input to the system. Although a human being is illustrated as the user 802, one of ordinary skill in the art would recognize that user 802 may be any metal or conductive object, for example, a robot, having a capacitance that may be sensed by sensing electrodes, for example, the gesture sensing electrodes of the wall controller. The wall controller 804 is similar to the wall controller discussed above in FIGS. 1-4, encompasses any type of device, component or combination that communicates with a lighting system to control operation of luminaires, and is not limited to wall mounting. Descriptions of the components of the wall controller will not be repeated here.

Figure 9:
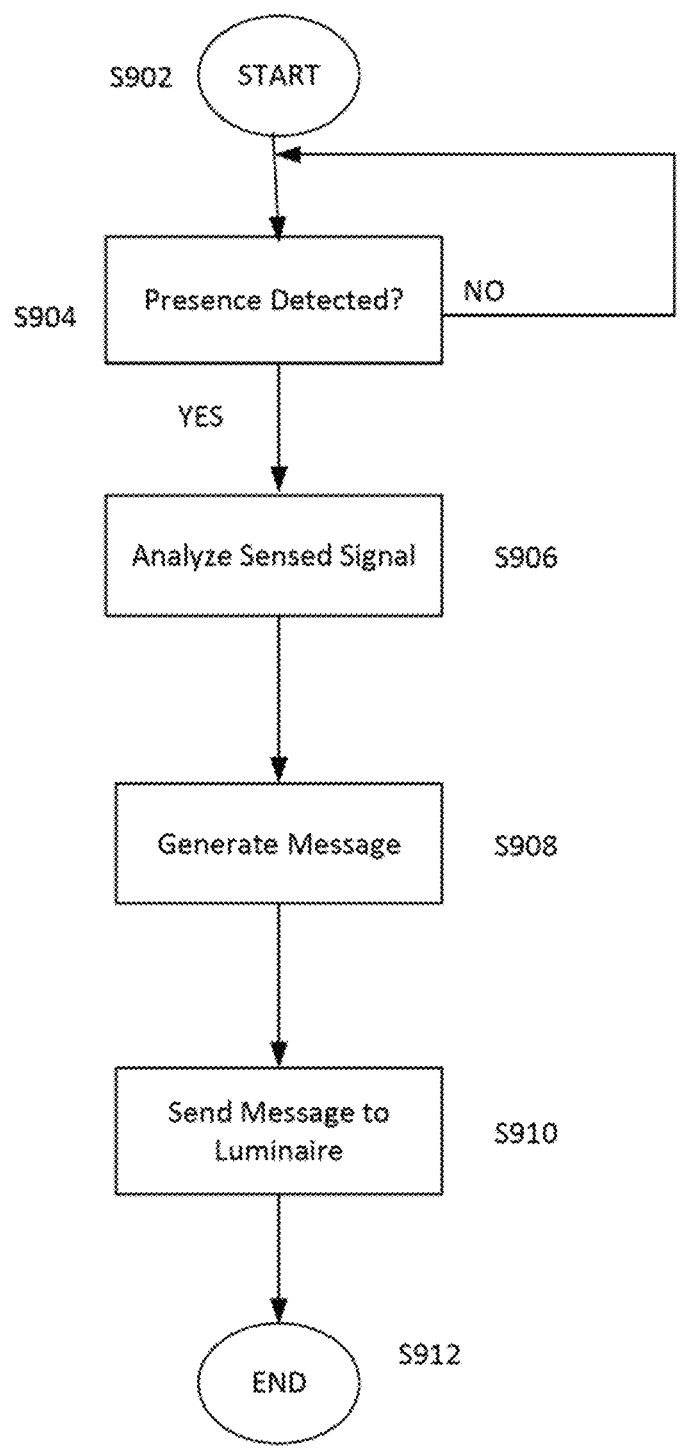
FIG. 9 is a flow chart illustrating a process for controlling a lighting system in accordance with proximity detection of user or signal input by the wall controller of the lighting system in FIG. 1.

FIG. 9 is a flow chart illustrating a process for controlling a lighting system in accordance with proximity detection of a user or signal input by the wall controller such as by the user 802 and wall controller 804 of FIG. 8.

The process for controlling a lighting system in accordance with proximity detection starts at step S902 when the wall controller of the lighting system is turned ON. In the ON position, power is supplied to the components of the wall controller; however, the wall controller may be in one of an active or sleep mode.

At S904, a decision is made regarding the presence of a conductive object within a predetermined distance to a surface of the wall controller. The conductive object may be an appendage of a human body, for example, a hand, a finger, a foot, or a metal object within a predetermined distance of 0-25 cm, for example, to a surface of the wall controller that is sensed or detected by sensing electrodes arranged on a substrate of the wall control. In an example, the user input may be sensed by at least one of the touch sensing electrodes 104A or the gesture sensing electrodes 104B (FIG. 4). The gesture sensing electrodes 104B are electric field sensors arranged on the substrate of the wall controller to detect a conductive material or object. At least four (4) gesture sensing electrodes are arranged at a perimeter of a substrate or printed circuit board of the wall controller. The touch sensing electrodes 104A (FIG. 4) are arranged in a central portion of the substrate, and may be configured to detect a change in capacitance due to proximity of a non-physical touch, as well as a physical touch at a surface of the electrode. Any number, arrangement and combination of sensing electrodes may be mounted on the substrate of the wall controller. As illustrated in FIGS. 8A and 8B, the presence of the conductive object within the predetermined distance of the wall controller may be the result, for example, of a human approaching or proximate a surface of the wall controller. Firmware and instructions, included within or accessible to the wall controller, define a plurality of lighting functions for the lighting system that are relative to touch and gesture inputs, and a configuration of the touch and gesture sensing electrodes on the substrate. When NO, the presence of a conductive object is not detected, the process remains at S904 in a sleep mode until a conductive object is detected. When YES, a conductive object is detected, a processor of the wall controller may switch the wall controller from the sleep mode to a normal mode, and the process continues to step S906.

At S906, when a conductive object is detected and the wall controller is in the normal mode, additional sensing signals received by at least the capacitive gesture driver and sensing circuit of the wall controller are analyzed to determine a lighting function of the sensed user input. In an example, the initial user input of FIGS. 8A and 8B would be the user approaching or proximate the wall controller that are sensed by at least the gesture sensing electrodes, and the capacitive gesture driver and sensing circuit coupled to the gesture sensing electrodes. With the initial user input of FIGS. 8A and 8B, the user is detected in the area of the wall controller and the wall controller is switched to a normal mode. Instructions stored in the processor of the wall controller may, for example, illuminate a surface of the wall controller to receive new user touch or gesture input. After the initial user input, new user input may be sensed by sensing electrodes, for example, the touch sensing electrodes or the gesture sensing electrodes, or a combination of the touch and sensing electrodes of the wall controller. The additional user input sensed at the surface of the wall controller is analyzed to determine a user selected lighting function. The wall controller includes firmware that may be stored on storage media or accessible to the wall controller to define lighting functions relative to the user inputs, for example, motion gestures, near a surface of the wall controller or user touch inputs on a surface of the wall controller.

At S908, the processor of the wall controller generates a lighting control message in response to the analyzed sensing signals.

At S910, the lighting control message generated at S908 is transmitted to one or more luminaires in an area of the wall controller to control an output of the one or more luminaires based upon the detected presence of the conductive object, user input at the surface of the wall controller and the instructions and firmware of the wall controller.

The process ends at S912 after the lighting control message is transmitted to the one or more luminaires.

Program aspects of the technology may be thought of as "products" or "articles of manufacture" typically in the form of executable code and/or associated data that is carried on or embodied in a type of machine readable medium. For example, programming code could include code for the CPU or the processor of the wall controller, luminaire or gateway server, as well as firmware and software for the wall controller. "Storage" type media include any or all of the tangible memory of the computers, processors, luminaires, wall controller or the like, or associated modules thereof, such as various semiconductor memories, tape drives, disk drives and the like, which may provide non-transitory storage at any time for the software programming or firmware of the wall controller. All or portions of the software may at times be communicated through the Internet or various other telecommunications networks. Such communications, for example, may enable loading of the software from one computer or processor into another, for example, from a management server or host computer of the service provider into the computer platforms of the gateway and client device, or the loading of program code to the MCU of the wall controller for coordination with the storage media and instructions of the wall controller. Another type of media that may bear the programming, media content includes optical, electrical and electromagnetic waves, such as used across physical interfaces between local devices, through wired and optical landline networks and over various airlinks. The physical elements that carry such waves, such as wired or wireless links also may be considered as media bearing the software. As used herein, unless restricted to "non-transitory", "tangible", or "storage" media, terms such as computer, storage medium or machine "readable medium" refer to any medium that participates in providing instructions or data to a processor for execution or instructions and firmware to the wall controller.

Hence, a machine readable medium may take many forms of tangible storage medium. Non-volatile storage media include, for example, optical or magnetic disks, such as any of the storage devices in any computer(s) or the like, such as may be used to implement the devices including the wall controller, or gateway, shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example, floppy disks, a flexible disk, hard disk, magnetic tape or other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequence of one or more instructions to a processor for execution.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirements of Sections 101, 102, or 103 of the Patent Act, nor should they be interpreted in such a way. An unintended embracement of such subject matter is hereby disclaimed.

Except as stated immediately above, nothing that has been stated or illustrated is intended or should be interpreted to cause a dedication of any component, step, feature, benefit, or advantage to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A wall controller for lighting, comprising:
a substrate;
a plurality of sensing electrodes mounted to the substrate;
at least one driver and sensing circuit coupled to the sensing electrodes;

a lighting network data communication interface configured to provide communications with one or more luminaires in an area of the wall controller via a data communications network;

a processor coupled to receive sensing signals from the driver and sensing circuit for user inputs at a surface of the wall controller, wherein the processor is coupled to the lighting network data communication interface and configured to process the sensing signals, and send lighting control messages, via the interface, to the one or more luminaires in the area of the wall controller to control an output of the one or more luminaires based upon the user inputs at the surface of the wall controller;

memory coupled to be accessible to the processor; and programming in the memory, wherein the memory stores the programming for execution by the processor and data to be saved or processed by the processor during execution of instructions included in the programming, wherein execution of the programming in the memory configures the processor to:

receive a plurality of user inputs at the surface of the wall controller, wherein the plurality of user inputs are sensed by the sensing electrodes;

determine whether or not the plurality of user inputs at the surface of the wall controller correspond to a user input selection to perform one of a plurality of defined lighting functions;

when the determined plurality of user inputs at the surface of the wall controller do not correspond to any of the defined lighting functions, count a number of the user inputs not corresponding to any of the defined lighting function to provide an indicator of activity at the surface of the wall controller, wherein when the indicator of activity satisfies a predetermined threshold within a period of time, activate a locked mode for the wall controller, and wherein during the locked mode, each new sensed user input at the surface of the wall controller is rendered invalid; and initiate a timer to check for new sensed inputs at the surface of the wall controller during the locked mode, at an expiration of the timer, when there are new sensed inputs not corresponding to any of the defined lighting functions, the timer is reset to continue checking for new sensed inputs at the surface of the wall controller, or at an expiration of the timer, when there are new sensed inputs that correspond to a user input selection to perform one of the defined lighting functions, the locked mode is deactivated, and operation of the wall controller is a normal mode.

2. The wall controller of claim 1, wherein execution of the programming further configures the processor to detect a presence of a conductive object within a predetermined distance to the wall controller in response to a sensing signal received from the driver and sensing circuit, wherein operation of the wall controller is a normal mode when the presence of the conductive object is detected.

3. The wall controller of claim 1, wherein the plurality of user inputs at the surface of the wall controller are sensed by at least one of touch sensing electrodes or gesture sensing electrodes arranged on the substrate of the wall controller.

4. The wall controller of claim 1, wherein the user input selection to perform the defined lighting functions include user touches at locations on the wall controller or user gestures near the wall controller corresponding to the instructions of the wall controller.

5. The wall controller of claim 1, wherein the locked mode remains for a duration of the new sensed inputs at the surface of the wall controller not corresponding to any of the defined lighting functions.

6. The wall controller of claim 1, further comprising storage media to accommodate the instructions included in the programming.

7. The wall controller of claim 1, wherein the plurality of sensing electrodes include an arrangement of touch sensing electrodes.

8. The wall controller of claim 1, wherein the plurality of sensing electrodes include an arrangement of gesture sensing electrodes.

9. The wall controller of claim 1, wherein the plurality of sensing electrodes include an arrangement of touch sensing electrodes and gesture sensing electrodes.

10. The wall controller of claim 9, wherein the touch sensing electrodes are arranged in a central area of the substrate.

11. The wall controller of claim 9, wherein at least four gesture electrodes are arranged at a perimeter of the substrate.

12. A method, comprising:

receiving a plurality of user inputs at a surface of a lighting wall controller, wherein the plurality of user inputs are sensed by at least one of touch sensing electrodes or gesture sensing electrodes arranged on a substrate of the wall controller, wherein the wall controller includes instructions to define a plurality of lighting functions relative to the user inputs at the surface of the wall controller;

determining whether or not the plurality of user inputs at the surface of the wall controller correspond to touches at locations on the wall controller or user gestures near the wall controller for a user input selection to perform one of the defined lighting functions;

when the determined plurality of user inputs at the surface of the wall controller do not correspond to any of the defined lighting functions, count a number of the user inputs not corresponding to any of the defined lighting functions to provide an indicator of activity at the surface of the wall controller, wherein when the indicator of activity satisfies a predetermined threshold within a period of time, activating a locked mode for the wall controller, and wherein during the locked mode, each new sensed user input at the surface of the wall controller is rendered invalid; and initiating a timer to check for new sensed inputs at the surface of the wall controller during the locked mode, wherein:

at an expiration of the timer, when there are new sensed inputs not corresponding to any of the defined lighting functions, the timer is reset to continue checking for new sensed inputs at the surface of the wall controller, or at an expiration of the timer, when there are new sensed inputs that correspond to a user input selection to perform one of the plurality of defined lighting functions, the locked mode is deactivated, and operation of the wall controller is a normal mode.

13. The method of claim 12, further comprising detecting a presence of a conductive object within a predetermined distance to the wall controller in response to sensing signals received from at least one driver and sensing circuit, wherein operation of the wall controller is a normal mode when the presence of the conductive object is detected.

14. The method of claim 12, wherein the processor is configured to process user inputs in accordance with the instructions of the wall controller.

\* \* \* \* \*